United States Patent [19]

De Koning et al.

[11] Patent Number: 4,783,819

[45] Date of Patent: Nov. 8, 1988

[54] AUTOMATICALLY CONTROLLED AMPLIFIER ARRANGEMENT

[75] Inventors: Stephanus H. De Koning; Alexander Verwijmeren, both of Breda, Netherlands

[73] Assignee: U.S. Philips Corporation, New York, N.Y.

[21] Appl. No.: 15,453

[22] Filed: Feb. 17, 1987

[30] Foreign Application Priority Data

Feb. 18, 1986 [NL] Netherlands ............... 8600406

[51] Int. Cl.$^4$ ............................................. H04R 27/00
[52] U.S. Cl. ........................................ 381/83; 381/93
[58] Field of Search ............... 381/83, 93, 98, 103, 381/108

[56] References Cited

U.S. PATENT DOCUMENTS

4,064,462  12/1977  Goethler et al. ............... 381/83
4,079,199  3/1978   Patronis, Jr. .................. 381/83
4,088,834  9/1978   Thurmond ..................... 381/83
4,602,337  7/1986   Cox ............................. 381/83

*Primary Examiner*—Forester W. Isen
*Attorney, Agent, or Firm*—Bernard Franzblau

[57] ABSTRACT

An automatically controlled amplifier arrangement comprises a controlled amplifier unit (35), a detection unit (2) for detecting oscillations of the arrangement in the case of acoustic feedback during operation, and a control unit (3) which, in response to the detection unit (2), controls the gain of the amplifier unit (35). The controlled amplifier unit comprises separate control means for separately controlling the gain for different frequency bands (1', 1'', 1''') below the howling limit. Prior to this a pre-adjustment is effected. Further, a circuit is proposed which increases the gain during preadjustment until oscillation occurs and which subsequently reduces the gain (if desired for each frequency band) until an adjustable margin below the howling limit is obtained (if desired for each frequency band).

12 Claims, 6 Drawing Sheets

FIG. 7

AUTOMATICALLY CONTROLLED AMPLIFIER ARRANGEMENT

This invention relates to an automatically controlled amplifier arrangement having at least one input and at least one output, comprising a controllable amplifier unit, a detection unit coupled to the input to detect oscillations of the arrangement in the case of acoustic feedback during operation, and a control unit which controls the gain of the amplifier unit under the influence of the detection unit.

Such an automatically controlled amplifier arrangement is described in U.S. Pat. No. 4,079,199. If one or more microphones are connected to the inputs and one or more loudspeakers are connected to the outputs of such an arrangement, oscillations may occur in the event of acoustic feedback between one or more of the loudspeakers and one or more of the microphones. Such a situation may occur when the arrangement is used for amplifying speech signals or music signals in an auditorium. The frequencies at which oscillations may occur depend inter alia on the geometry of the auditorium, the temperature and relative humidity, the distance between the speaker and the microphone, and the number of listeners in the auditorium. Therefore the oscillation frequencies are of a more or less stochastic nature. In order to counteract these oscillations it is proposed in U.S. Pat. No. 4,079,199 to detect random oscillations and subsequently to reduce the gain of the arrangement until the oscillations are eliminated. After a waiting period the gain of the arrangement is then increased again automatically. As a result of this, it is always possible that in the known arrangement random oscillations occur, for example, because the characteristics of the auditorium have changed, for example when the number of listeners has increased or decreased.

It is an object of the invention to eliminate or at least mitigate this drawback and other drawbacks of the known arrangement and to this end the invention includes an amplifier arrangement of the type defined in the opening paragraph wherein the controlled amplifier unit comprises separate control means for separately controlling the gain for different frequency bands to a value below the howling limit. In this way an optimum setting of the gain for all the frequency bands can be obtained. This optimum gain for all the frequency bands cannot be obtained by means of the arrangement described in U.S. Pat. No. 4,079,199. In accordance with said Patent the gain is reduced until oscillations just cease at the frequency for which the gain is maximal. In practice, this means that for other frequency bands the gain may be too low. This problem is precluded by the inventive step herein.

A further disadvantage of the known arrangement is that it utilizes detectors of small bandwidth for detecting oscillations, requiring a comparatively large number of detectors to enable the entire frequency range to be covered. In order to eliminate this disadvantage of the known arrangement, the amplifier arrangement in accordance with the invention is suitably constructed in such a way that the unit for detecting oscillations is reponsive to a beginning or increasing oscillation. According to the invention an embodiment based on this principle is characterized in that the unit for detecting oscillations comprises at least two rectifying circuits to which the signal to be amplified, or a portion of the signal to be amplified, is applied, at least two integrating circuits having different time constants and different gain factors, and a comparator circuit to which the output signals of the integratinq circuits are applied as input signals, the comparator circuit supplying an output signal when the amplitude of one of the two input signals exceeds that of the other one. This step ensures that for each separate control means for controlling the gain, only one detection means is required when these separate control means are controlled simultaneously, and that even only one detection means is required even when the control means for controlling the gain are not controlled simultaneously, but sequentially.

Another drawback of the arrangement in accordance with U.S. Pat. No. 4,079,199 is that even when the gain settinq is such that spontaneous oscillations do not occur, or only very rarely, ringing or tonal coloration (non-linear amplification) may arise because the gain setting may be such that the open-loop gain is close to unity and the phase shift of the arrangement is close to a value which is a multiple of 360 degrees.

In order to eliminate this problem the amplifier arrangement in accordance with the invention is characterized in that it comprises means for gradually increasing the gain for each frequency band until oscillation occurs and subsequently reducing the gain for each frequency band by an adjustable difference relative to the value of the gain at which oscillation occurs.

In a further embodiment of the invention, this variable difference differs in each frequency range. However, suitably the variable difference over the entire frequency range is −5 dB to −8 dB for speech at the maximum gain and a few dBs higher for music. In practice it has been found that this guarantees ringing-free operation of the amplifier arrangement.

Suitably, the arrangement in accordance with the two invention comprises means for increasing the gain in each frequency band to a value at which oscillation occurs and for subsequently reducing the gain for each frequency band by a fixed amount, and for repeating said process of increasing until oscillation occurs and reducing by a fixed amount until the value of the gain thus reached corresponds to the preceding maximum value. This iterative control process results in a setting being sound signals (for example when a door is slammed) is selected which provides a maximal gain. This ensures that the influence of brief random peaks in the eliminated.

A further preferred embodiment of the invention is characterized in that it comprises means which supply a signal when no oscillations have occurred in one or more frequency bands within a specific time interval while the gain is increased. This precludes an incorrect control when the volume setting of the arrangement is too low, so that no oscillations at all can occur or oscilation can occur only for specific frequency bands.

The amplifier arrangement in accordance with the invention will now be described in more detail, by way of example, with reference to the accompanying drawings, in which:

FIG. 3a is a more detailed diagram of the variant of FIG. 2a;

Figure 1:
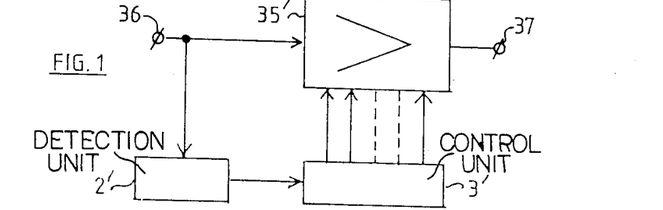
FIG. 1 is a diagram illustrating the principle of the amplifier arrangement in accordance with the invention.

In FIG. 1 the reference numeral 36 denotes the input of the amplifier arrangement. One or more microphones may be coupled to this input, a summing network being added in the case where a plurality of microphones is utilized. The output of the arrangement bears the reference numeral 37. One or more loudspeakers may be coupled to the output of this arrangement. The input signals are applied to an amplifier unit 35' whose gain can be controlled. The input signals are also applied to a detection unit 2' which detects oscillations in the input signal and, depending on the detection of such oscillations, transfers an output signal to the control unit 3' which supplies output signals for controlling the gain of the amplifier unit 35' for the various frequency bands.

Figure 2:
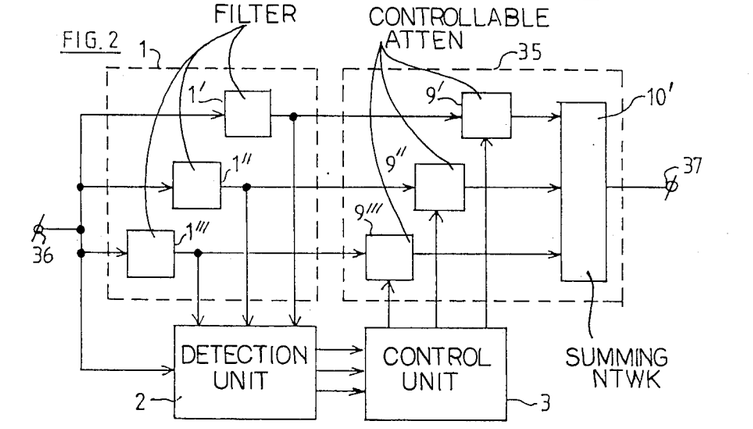
FIG. 2 is a block diagram of one of the possible variants of the amplifier arrangement shown in FIG. 1.

FIG. 2 is a block diagram of one of the possible variants of the amplifier arrangement of FIG. 1. Corresponding parts bear the same reference numerals. The filter section 1 may comprise different filters 1', 1" and 1''', the number of filters being as is desired or necessary. The amplifier unit 35 may comprise a corresponding number of controlled attenuators 9', 9" and 9''' and a summing network 10' including an amplifier. Both the input 36 and the outputs of the filters 1', 1", 1''' are coupled to the inputs of the detection unit 2. The detection unit 2 separately detects oscillations for each of the individual frequency bands and for each of the frequency bands an output signal is generated and applied to the control unit 3, which unit generates control signals for each of the frequency bands and applies these control signals to the variable attenuators 9', 9" and 9'''.

Figure 2A:
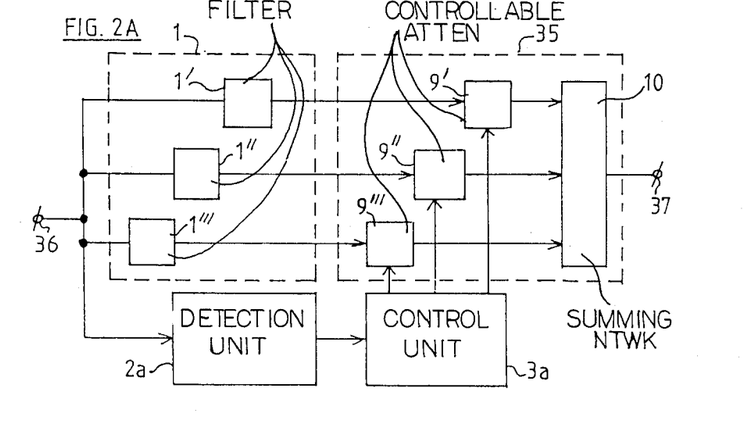
FIG. 2a shows a block diagram of another variant of the amplifier arrangement shown in FIG. 1.

The embodiment shown in FIG. 2a differs from the embodiment shown in FIG. 2 in that the detection unit 2a generates a single detection signal for the entire frequency range. The variable attenuators are then controlled time-sequentially by the control unit 3a. This is effected in such a way that initially only one attenuator transmits a signal. The other attenuators then do not transmit a signal. Subsequently, the attenuation of one attenuator is reduced until oscillation occurs for the relevant frequency band. Then the attenution of the relevant attenuator is increased by a fixed amount and subsequently this setting is fixed. After this the attenuation of the next attenuator is reduced until oscillation occurs and is again increased by a fixed amount and fixed. This process is repeated until all attenuators are set.

Figure 3:
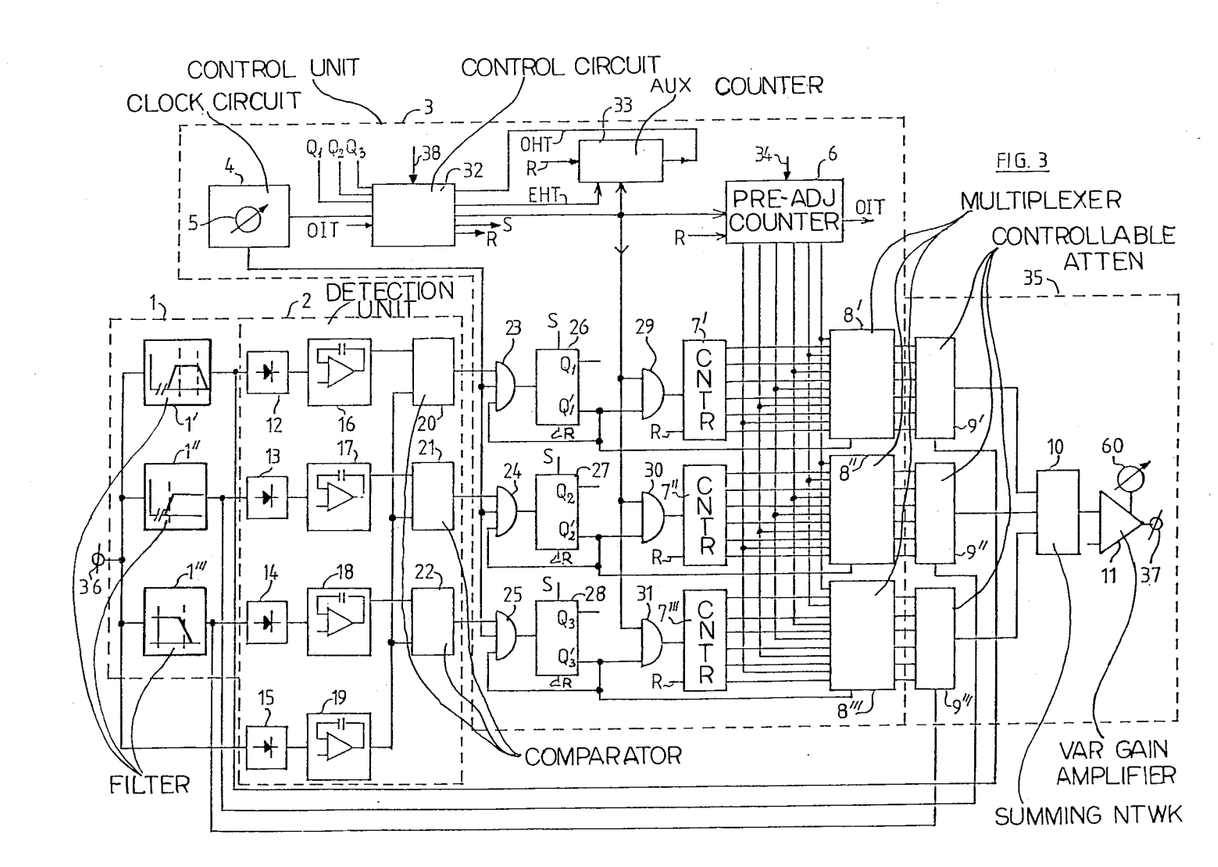
FIG. 3 is a more detailed diagram of the variant shown in FIG. 2.

In the more detailed diaqram of FIG. 3, which shows a variant of the arrangement in accordance with the invention shown in FIG. 2, corresponding reference numerals relate to corresponding parts. For the sake of simplicity FIG. 3 does not show the circuits required for obtaining a well-defined initial state and the associated connections. During starting a reset signal R is generated in the control circuit 32 via the input 38. This is indicated by the letter R near all of the inputs to which this reset signal is applied. When a reset signal is generated, the Q outputs of the flip-flops 26, 27 and 28 are logic "0", the count of the storage counters 7', 7" and 7''' has the value 0 or another desired value (to be discussed hereinafter), the pre-adjustment counter has a desired preset count and the auxiliary counter is set to a value 0 (or if desired another initial setting). The signal required for setting the actual control circuit 32 to the desired initial state is generated in the circuit 32 (master reset). The clock circuit 4 has an adjustable frequency which can be adjusted by means of the adjusting element 5. This adjustable frequency is necessary to obtain a correct setting of the attenuators for auditoriums of different dimensions. The clock 4 generates a clock signal of comparatively high frequency, which is applied to the AND gates 23, 24 and 25, and it generates a clock signal of a relatively lower frequency, which is applied to the control circuit 32. The reference numeral 38 schematically denotes a start input by means of which the pre-adjustment process is started. The control circuit 32 inter alia serves to ensure that the first clock pulse, to be transferred to the counter 6, to the auxiliary counter 33 and to the AND gates 29, 30 and 31 after starting, is transferred in a well-defined manner. Near the control circuit 32 input signals, which originate from the remainder of the arrangement, are shown schematically and output signals are shown which serve inter alia for setting and resetting the latching circuits (flip-flops and counters) in the arrangement. Similar designations denote an electric coupling between inputs and outputs with the same signal designation. The counter 6 has an input 34 by means of which this counter can be set to a predetermined initial state. The reference numeral 1' denotes a high-pass filter, 1" is a band-pass filter which transmits the mid range, and 1''' is a low-pass filter. The output signals of these filters are applied to the full-wave rectifiers 12, 13 and 14 and the complete signal is applied to the full-wave rectifier 15. The rectifiers may comprise operational amplifiers arranged in known manner. The output signals of the rectifiers are applied to integrating amplifiers 16, 17, 18 and 19. For each of the frequency ranges the output signal of the integrating amplifier is applied to one input of the respective comparator 20, 21 and 22, whose other input receives the output signal from the integrating amplifier 19. The output signals of the comparators are applied to AND gates 23, 24 and 25, whose outputs are connected to the trigger inputs of master-slave J-K flip-flops 26, 27 and 28, whose inverting outputs are fed back to the inputs of the respective AND gates 23, 24 and 25. The inverting outputs of the flip-flops 26, 27 and 28 are connected to the inputs of the AND gates 29, 30 and 31, whose other inputs receive a clock signal. The outputs of these AND gates 29, 30 and 31 are connected to the count inputs of the storage counters 7', 7" and 7''', whose output signals are applied to multiplexers or switching means 8', 8" and 8''', whose other set of inputs is driven by the counter 6. The switching means 8', 8" and 8''' transfer the output signals of either the pre-adjustment counter 6 or the storage counters 7', 7" and 7''' to digitally controllable attenuators 9', 9" and 9''', which also receive the high-frequency, the mid-frequency and the low-frequency signals, respectively. The output signals of the controllable attenuators are applied to the summing network 10, which is connected to an output amplifier 11 whose gain is variable (60).

Figure 4:
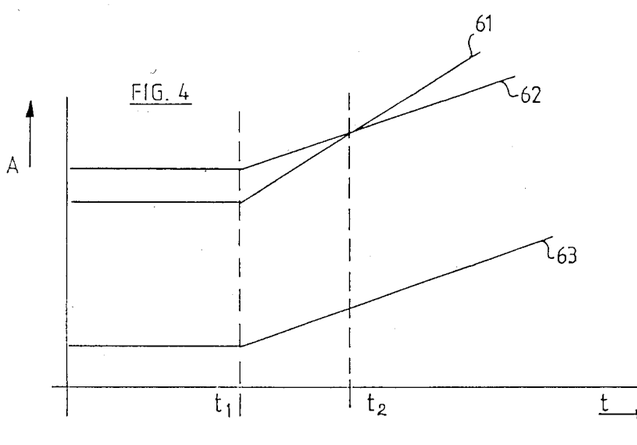
FIG. 4 shows some signals as a function of time in the case where the gain is not controlled.

In principle, the arrangement shown in FIG. 3 operates as follows. After a "start instruction" on the input 38 the initial state is established and the gain of the signal, divided into different frequency bands, is slowly increased by means of the pre-adjustment counter 6 whose count is transferred to the attenuators 9′, 9″ and 9‴ by the switching means 8′, 8″ and 8‴ under the influence of the outputs Q1′, Q2′ and Q3′, the attenuators being set accordingly until the howling limit (oscillation) is exceeded. Once howling (oscillation) is detected above the ambient sound, the gain of the frequency band in which howling occurs is reduced to a value for which the system is stable and a maximal gain is obtained, which is effected by taking over the count of corresponding storage counter, which count is lower than that of the pre-adjustment counter which has been preset upon starting, to set the relevant attenuator. After the gain has thus been set for all the frequency bands, this yields the maximum permissible gain for the specific operating conditions of the arrangement (the desired open-loop gain for each of the frequency bands). Pre-adjustment is based on a situation in which there is no (not yet) speech in the direct proximity of the microphone or microphones of the arrangement. The incoming audio signal then comprises the diffuse ambient sound. The gain is increased until oscillation occurs. The oscillating signal is characterized by a rapid rise in amplitude. This rapid rise in amplitude is detected in accordance with the principle illustrated in FIG. 4. Essentially, this principle is based on rectification of the signal or a portion of the signal in which oscillations occur. After rectification this signal is applied to two integrators having different time constants and different gain factors. The integrator 19 of FIG. 3, for example, has a higher gain and a larger integration constant than the integrating amplifiers 16, 17 and 18. The output signal of the integrating amplifier 19 will then vary as is indicated by the reference numeral 62 in FIG. 4, while the output signals of the integrating amplifiers. The output signals of the comparator 20, amplifiers 16, 17 and 18 will vary as is indicated by the reference numeral 61 in FIG. 4 when ringing occurs in one or more of the relevant frequency bands. The sound level in the auditorium is represented by the signal 63. When no howling occurs (prior to the instant t1) the output signal of the integrating amplifier 19 has a higher level than the output signal of the other integrating amplifiers. The output signals of the comparators 20, 21 and 22 will then inhibit the AND gates 23, 24 and 25. If now an oscillation begins, the sound level in the auditorium will rise rapidly (the instant t1). However, the output signal of the integrator 19 will then increase less rapidly than the output signal of the other integrators, so that a crossing point is obtained at the instant t2, causing the output signal of the relevant comparator to enable the associated AND gate. The output of the relevant AND gate (23, 24, 25) then causes the associated flip-flop (26, 27 or 28) to be changed over upon the next clock pulse appearing at said gate, so that the associated AND gate (29, 30 or 31) is inhibited and no more counting pulses can be applied to the associated storage counter (7′, 7″ or 7‴). At the same time the associated multiplexer is changed over by the Q′ output of the relevant flip-flop (26, 27 or 28) so that, instead of the count of the counter 6, the count of the relevant storage counter (7′, 7″ or 7‴) is applied to the relevant variable attenuator (9′, 9″ or 9‴). For a correct understanding it is to be noted that the attenuation of the attenuators decreases as the instantaneous count of the driving counter increases. At the instant of starting the pre-adjustment counter 6 is given a preset count to advance it. The pre-adjustment counter 6 and the storage counters 7′, 7″ and 7‴ are incremented simultaneously. If oscillation is detected in one of the frequency bands no more clock pulses are applied to the relevant storage counter (7′, 7″ and 7‴) and the count of the relevant storage counter, which is lower than that of the counter 6, is latched. This process continues and the pre-adjustment counter 6 is incremented until oscillations have been detected in all frequency bands. All the attenuators then have the correct settings and the control process is terminated. The preset count of the counter 6 by which it is advanced with respect to the storage counters 7′, 7″ and 7‴ determines the extent to which the gain is reduced upon the detection of oscillations.

When oscillation is detected and the difference between the two counters (the pre-adjustment counter 6 and one of the storage counters 7′, 7″ or 7‴) is, for example, "5" the open-loop gain after switching over will be reduced by a factor which is equal to 5 times the "step size" of the variable attenuator. Since this number of steps is adjustable by presetting of the pre-adjustment counter 6, this results in an arrangement which sets itself to a previously adjustable howling margin. Moreover, the degree of howling is adapted to the ambient noise and can be adjusted by adjusting the difference between the levels of the signals 60, 61 and 62 (FIG. 4), i.e. by adjusting the gain of the integrating amplifier 19 and the integration constant of the integrating amplifier 19 (adjusting the instant t2), enabling the duration of the resulting oscillation to be limited in such a way that the resulting oscillation effect is not annoying to the audience. Since howling detection takes longer in a large auditorium than in a small auditorium because the "build-up time" for howling in a large auditorium is longer than in a small auditorium, the frequency of the clock 4 is adjustable by means of the adjusting element 5. This prevents the gain from being increased erroneously in the event that there is already a beginning oscillation which has not yet been detected.

Figure 5:
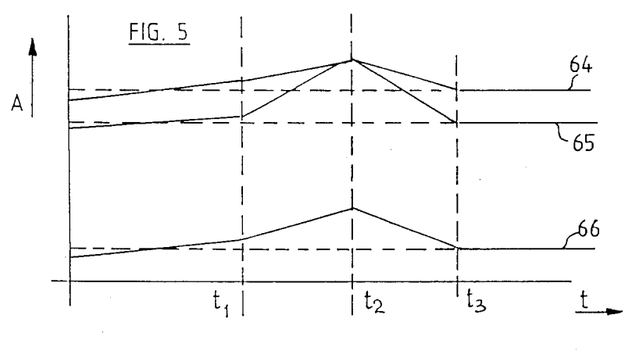
FIG. 5 shows the signals of FIG. 4 as a function of time when the gain is controlled.

FIG. 5 illustrates the situation for the various signals after pre-adjustment of the gain. The signal 64 is the output signal of the integrating amplifier 19, the signal 65 is the output signal of one or more of the integrating amplifiers 16, 17 or 18, and 66 represents the sound level in the auditorium. After pre-adjustment the various levels are a fraction lower than briefly before oscillation.

The reference numeral 33 in FIG. 3 denotes an auxiliary counter. This auxiliary counter is incremented simultaneously with the other storage counters after an oscillation has been detected in one of the frequency bands. The output signal OHT (overflow auxiliary counter) may be used in conjunction with, for example, the output signals of the flip-flops 26, 27 and 28 to detect an incorrect setting. For this purpose the signals OHT (overflow auxiliary counter), the signals Q1, Q2, Q3 and the signal EHT (enable auxiliary counter) are used. The signal EHT may become "1" (enable count input for clock pulses) when one or more of the flip-flops 26, 27 or 28 are set (an oscillation has occurred in one or more frequency bands). When EHT is "1" the auxiliary counter 33 is started. If pre-adjustment of the other channels now takes too long, which would give rise to an excessive tone coloration, signal OHT may be generated ("1") by overflow of the auxiliary counter. By means of signal OHT the signal S then becomes a logic "1" (in the control circuit 32), the flip-flops 26, 27 and 28 are set, and consequently the storage counters are stopped. The consecutive appearance of Q1 or Q2 or Q3=1 and OHT=1 before the two other flip-flops have been set therefore indicates that there is an incorrect setting. If this sequence appears, signal OHT in the control circuit generates the signal S, causing the flip-flops 26, 27 and 28 to be set and subsequently the supply of clock pulses to be terminated by means of the outputs Q1, Q2 and Q3 and the control circuit 32. The circuit is then again in a state in which it can be restarted by means of input 38, while a display can be activated to indicate the fault condition.

If oscillation has not occurred in each of the frequency bands after a predetermined number of clock pulses have appeared, the arrangement is not correctly pre-adjusted (this is a second fault condition) and the sound system must be modified (for example by changing the volume setting or the tone setting, by loudspeaker matching or by adapting the type of loudspeaker). The second fault condition occurs when the pre-adjustment counter 6 overflows, OIT=1. This is because the control counter continues to count until: Q1=1 and Q2=1 and Q3=1. If this condition is not met the pre-adjustment counter 6 continues to count and OIT=1. By means of OIT=1 the control circuit 32 generates S=1, Q1, Q2 and Q3 become 1, the control circuit 32 ceases to supply clock pulses, and the circuit is again ready to be started via input 38, while the fault condition may be visually displayed. It is also possible to give the storage counters 7', 7" and 7"' different presettings so that, after detection of an oscillation during pre-adjustment, the gain for each of the frequency bands is reduced by a different amount for each of the frequency bands. This is important in view of the interaction between the different frequency bands when the filters are not ideal, so that there interchannel crosstalk.

Figure 3A:
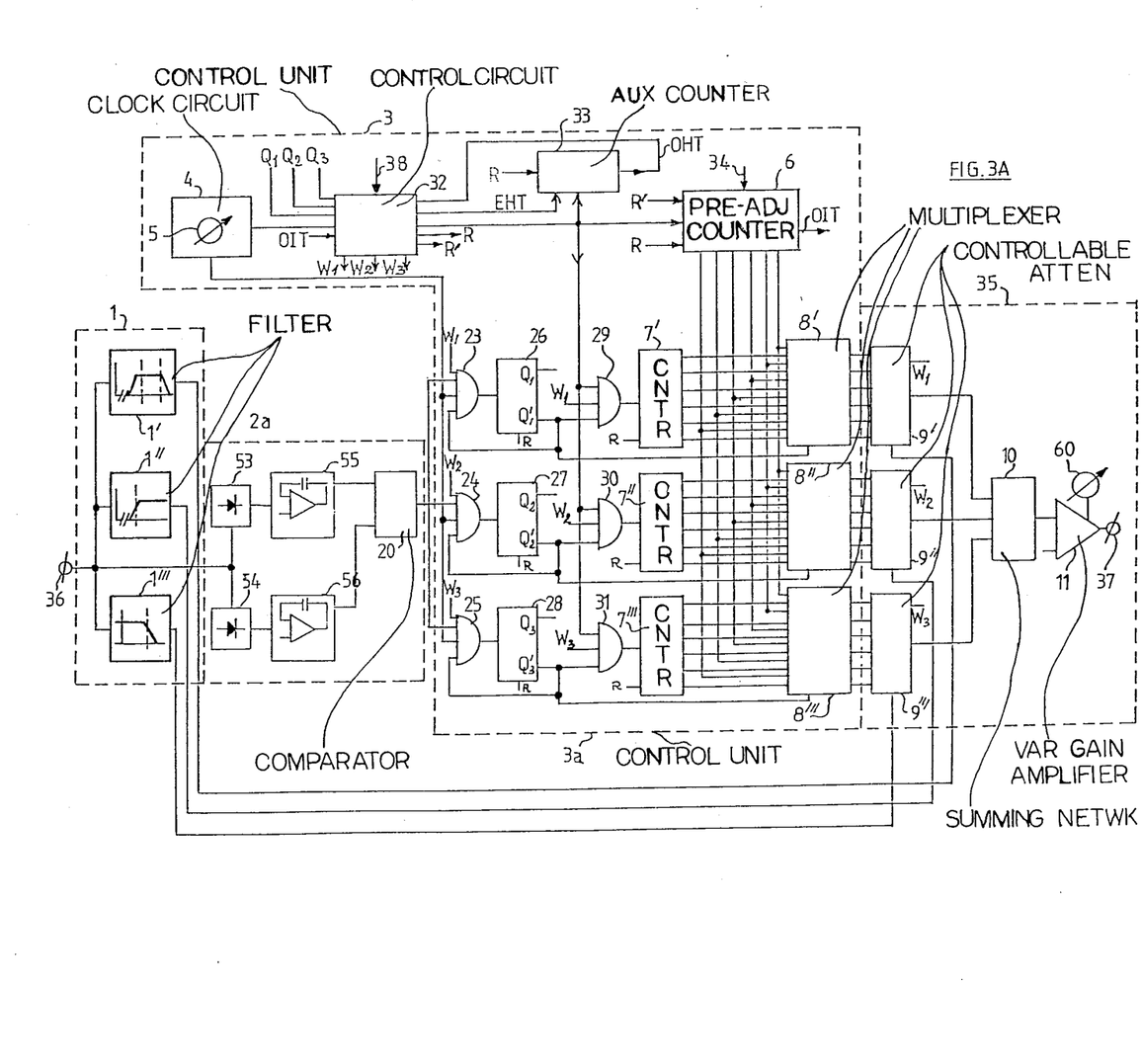
Figure 6:
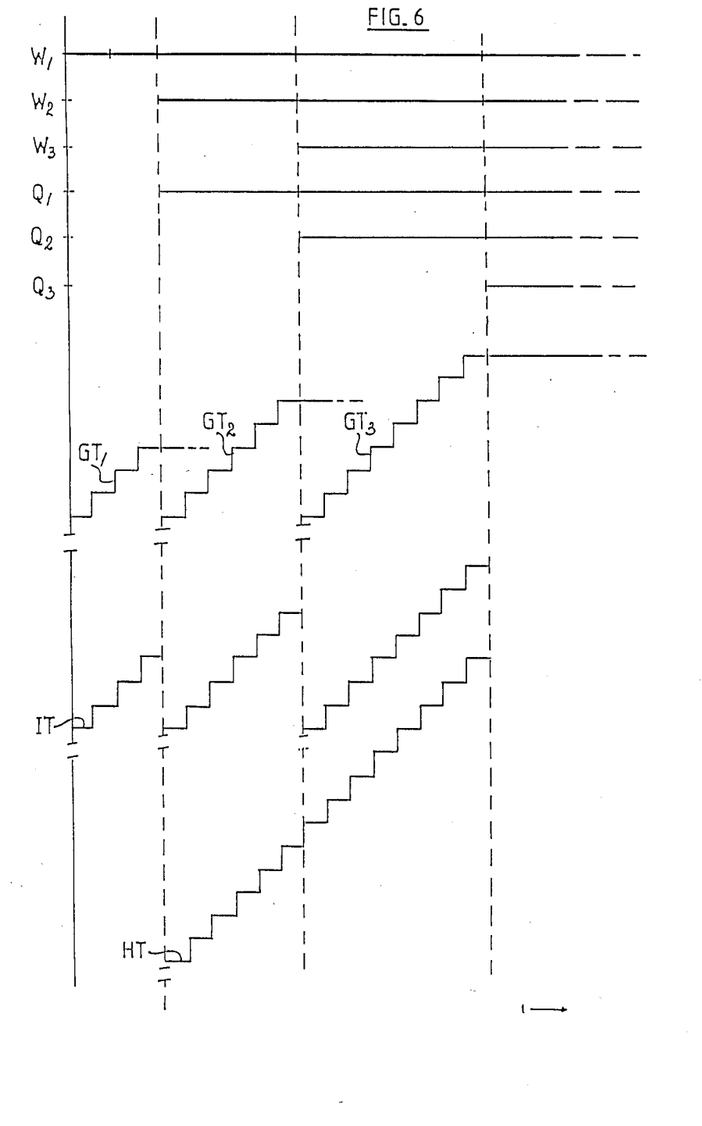
FIG. 6 shows some signals occurring in the variant of FIG. 3a as a function of time, and FIG. 7 diagrammatically illustrates the iteration of the control process for automatically obtaining a maximal gain.

FIG. 3a shows an arrangement in accordance with the invention in which preadjustment for the various frequency bands is in principle effected sequentially. For this purpose a detection circuit may be used which comprises two full-wave rectifying amplifier circuits 53 and 54, integrating amplifiers 55 or 56, and a comparator 20, to which the output signals of the amplifiers 55 and 56 are applied. Corresponding parts bear the same reference numerals as in FIG. 3. The circuit operates as follows. After the start signal the attenuation for all the frequency bands but one is adjusted in such a way that no signal is transmitted except for the one band. This band is generally the mid frequency band defined by the filter 1'. The gain is then gradually increased until oscillation is detected for said one frequency band, after which the gain is reduced by a previously adjustable amount. The other frequency bands are preadjusted consecutively. The control circuit 32 in FIG. 3a generates window signals or enable signals W1, W2, W3 having waveforms as shown in FIG. 6. After starting a reset pulse R is generated via the input 38. Then Q1=0, Q2=0 and Q3=0. The storage counters 7', 7" and 7"' then contain a "0" or another preset value. In FIG. 6 these counts bear the references GT1, GT2 and GT3. The counter 6 has a preset count. In FIG. 6 this is IT. The count of the auxiliary counter 33, HT in FIG. 6, is "0". W1=1 after the reset pulse. The gates 23 and 29 as well as the attenuator 9' are then enabled. The other channels are blocked for sound signals, for clock pulses from the control circuit 32, for clock pulses from the clock 4, and for the output signal of the comparator 20. The counts of the preadjustment counter and the storage counter 7' (GT1) are then incremented until the instant at which oscillation occurs in the relevant frequency band. The flip-flop 26 is then set, Q1=1 and the count of the storage counter 7' (GT1), which is lower than that of the preadjustment counter, is transferred to the attenuator 9'. The preadjustment counter is reset by means of the signal R' generated in the control circuit 32. Subsequently, the second channel is preadjusted in a corresponding manner. The two other channels remain in the adjusted position. Finally, the third channel is preadjusted. Then Q1=1, Q2=1 and Q3=1. The supply of clock signals by the circuit 32 is terminated. The control circuit 32 then has output values W1=1, W2=1 and W3=1, so that all attenuators 9', 9" and 9"' are enabled and the mid-frequency, high frequency and low-frequency signals are attenuated in conformity with the counts of the storage counters 7', 7" and 7"'. The overflow signal OIT from the preadjustment counter may again be utilized to indicate that preadjustment is not possible. The overflow signal OHT from the auxiliary counter 33 may then be used to indicate that an excessive tonal coloration has occurred. The enable signal EHT for the auxiliary counter may be generated, for example, when Q1=1. The auxiliary counter is then started and continues to count during preadjustment of the mid-frequency and the low-frequency signal. If this preadjustment takes too much time, this may be indicative of an excessive tonal coloration. The count of the auxiliary counter 33 is a measure of the sum of the time intervals required for the two adjustments and hence is a measure of the sum of the two tone colours. Consequently, the signal OHT is an indication of an excessive tonal coloration. The remainder of the circuit operates essentially in the same way as described with reference to FIG. 3.

Figure 7:
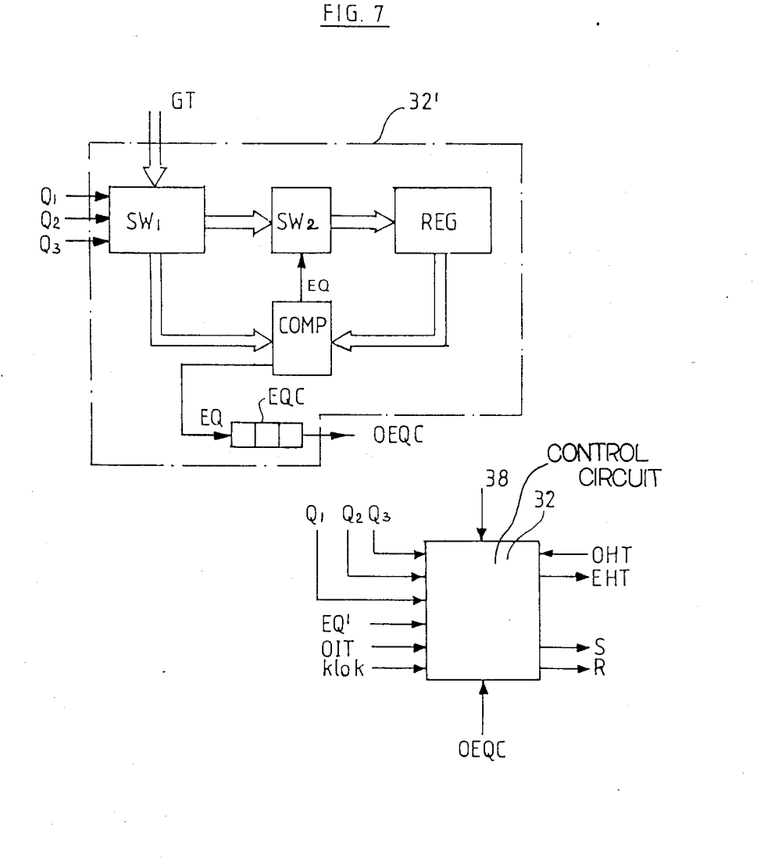

In order to eliminate the influence of random ambient sounds the preadjustment process in accordance with the invention is repeated until a setting is obtained corresponding to the preceding setting which provides the highest gain. For this purpose the counts of the storage counters 7', 7" and 7"' (FIG. 3) in the control circuit 32' obtained after preadjustment are compared with the previously obtained counts of these counters, as is shown schematically in the drawing (FIG. 7). When these counts correspond they have been obtained with the exclusion of random ambient sounds and the adjustment process is terminated, so that automatically a maximal value for the gain in each of the frequency bands is obtained. Repeating the adjustment process is possible by means of memories in the control circuit 32'. This can be achieved by means of a 6-bit storage capacity for each storage counter (for the embodiments described herein). This enables the preceding count of the storage counter to be compared with the instantaneous count of the storage counter. The control circuit then comprises a comparator for the comparison of these two counts. If the instantaneous count is equal to the preceding count, the instantaneous count is read into the storage location for the preceding count. This process is repeated under control of the control circuit 32 until the instantaneous count is found to be the same as the preceding count several times in succession. Then an optimum setting is obtained and the adjusting process is terminated.

In FIG. 7 an 18-bit data bus is used (three 6-bit storage counters). When the three storage counters have been adjusted (Q1=1, Q2=1 and Q3=1) the counts of the three storage counters are transferred to the comparator COMP via the switch SW1, which comparator compares these counts with the preceding counts of the three storage counters as stored in the memory REG.

When the counts of the storage counters are equal to the preceding counts the signal EQ=1 is generated. The occurrence of EQ=1 causes the count of the counter EQC to be incremented by 1, and the appearance of EQ=0 causes EQC to be decremented by 1. When EQC has, for example, 3 states the event EQ=1 should occur three times in succession before the signal OEQC=1 occurs (overflow of the counter EQC). The adjustment process is then terminated. Repeating the adjustment process when the preceding setting is different is effected by means of the signal EQ', which is applied to the control circuit 32 and which has the same function as the start signal 38 in this circuit. The instantaneous counts of the storage counters after comparison with the preceding counts are always read into the memory REG via the switch SW1, regardless of whether EQ=1 occurs.

What is claimed is:

1. An automatically controlled amplifier arrangement comprising: at least one input and at least one output, a controllable amplifier unit connected between said input and output and which comprises separate control means for separately controlling the gain for different frequency bands to a value below the howling limit, a detection unit coupled to the input to detect oscillations of the arrangement in the case of acoustic feedback during operation, and a control unit which controls the gain of the amplifier unit under the influence of the detection unit, characterized in that the unit for detecting oscillations comprises at least two rectifying circuits to which is applied the signal to be amplified or a portion of said signal, at least two integrating circuits having different time constants and different gain factors, and a comparator circuit to which output signals of the integrating circuits are applied as input signals, the comparator circuit supplying an output signal when the amplitude of one of two input signals applied thereto exceeds that of the other one of said input signals.

2. An amplifier arrangement as claimed in claim 1, characterized in that the unit for detecting oscillations is responsive to a beginning or increasing oscillation.

3. An amplifier arrangement as claimed in claim 1, characterized in that the detection unit has a single output for the entire frequency range for which the gain is to be adjusted, and in that the separate control means for separately controlling the gain factors of the different frequency bands are adjusted consecutively depending on the occurrence of an output signal of the detection unit.

4. An amplifier arrangement as claimed in claim 1, characterized in that the detection unit separately detects oscillations for different frequency bands and generates separate detection signals corresponding to the frequency bands, and in that the separate control means for separately controlling the gain for the different frequency bands are adjusted under control of the separate detection signals.

5. An amplifier arrangement as claimed in claims 1, 4 or 3, characterized in that it comprises means for increasing the gain in each frequency band to a value at which oscillation occurs and for subsequently reducing the gain for each frequency band by a fixed amount and for repeating said process of increasing gain until oscillation occurs and reducing gain by a fixed amount until a value of gain is reached that corresponds to a preceding maximum value.

6. An amplifier arrangement as claimed in claims 1, 4 or 3, characterized in that it comprises means for gradually increasing the gain for each frequency band until oscillation occurs and subsequently reducing the gain for each frequency band by an adjustable difference relative to the value of the gain at which oscillation occurs.

7. An amplifier arrangement as claimed in claims 1, 4 or 3, characterized in that it comprises means for supplying a signal when no oscillations have occurred in one or more frequency bands within a specific time interval while the gain is increased.

8. An amplifier arrangement as claimed in claim 6 wherein the adjustable difference is different for each frequency band.

9. An amplifier arrangement as claimed in claim 6 which comprises means for supplying a signal when no oscillations have occurred in one or more frequency bands within a specific time interval while the gain is increased.

10. A controlled amplifier arrangement comprising: an input for an audio signal and an output, a gain controlled amplifier unit coupled to said input and output and including control means for separately controlling amplifier gain to a value below the howling threshold for different frequency bands of the audio spectrum, a detection unit coupled to the input for detecting oscillations in the arrangement produced by acoustic feedback, said detection unit comprising at least first and second rectifier circuits with the first rectifier circuit coupled to the input so as to respond to all frequency components in an audio input signal and the second rectifier circuit coupled to said input so as to be responsive to a band of frequencies made up of less than all of the audio frequency components received at the input, at least one comparator circuit, at least first and second integrating circuits having different time constants and different gain factors, means coupling said rectifier circuits, said integrating circuits and said comparator in first and second cascade arrangements, the comparator circuit producing an output signal when the amplitude of an output signal of one integrating circuit exceeds the output signal of the other one of the integrating circuits, and a control unit responsive to said comparator circuit output signal for controlling the gain of said amplifier unit via said control means.

11. An amplifier arrangement as claimed in claim 10, wherein said detection unit is coupled to said input via a frequency filter unit.

12. An amplifier arrangement as claimed in claim 10 wherein said control means comprises at least first and second controlled attenuators receiving different frequency bands of the audio spectrum and separately adjustable by the control unit.

* * * * *